United States Patent
Forlenza et al.

(10) Patent No.: US 9,244,756 B1
(45) Date of Patent: Jan. 26, 2016

(54) LOGIC-BUILT-IN-SELF-TEST DIAGNOSTIC METHOD FOR ROOT CAUSE IDENTIFICATION

(71) Applicant: International Business Machines Corporation, Armonk, NY (US)

(72) Inventors: Donato O. Forlenza, Hopewell Junction, NY (US); Orazio P. Forlenza, Hopewell Junction, NY (US); Bryan J. Robbins, Beavercreek, OH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/446,516

(22) Filed: Jul. 30, 2014

(51) Int. Cl.
*G06F 11/07* (2006.01)
*G01R 31/3177* (2006.01)
*G01R 31/3187* (2006.01)
*G01R 31/3185* (2006.01)
*G06F 11/27* (2006.01)
*G01R 31/3183* (2006.01)

(52) U.S. Cl.
CPC .......... *G06F 11/079* (2013.01); *G01R 31/3177* (2013.01); *G01R 31/3185* (2013.01); *G01R 31/3187* (2013.01); *G01R 31/318547* (2013.01); *G01R 31/318371* (2013.01); *G01R 31/318533* (2013.01); *G01R 31/318536* (2013.01); *G06F 11/27* (2013.01)

(58) Field of Classification Search
CPC ... G06F 11/27; G06F 11/079; G01R 31/3187; G01R 31/318371; G01R 31/3185; G01R 31/3177; G01R 31/318533; G01R 31/318536; G01R 31/318547
USPC .................. 714/726, 727, 729, 731, 732, 733
See application file for complete search history.

(56) References Cited

U.S. PATENT DOCUMENTS

| | | | |
|---|---|---|---|
| 4,513,418 A | 4/1985 | Bardell, Jr. et al. | |
| 6,125,465 A | 9/2000 | McNamara et al. | |
| 6,442,723 B1 | 8/2002 | Koprowski et al. | |
| 6,654,920 B1 | 11/2003 | Hetherington et al. | |

(Continued)

OTHER PUBLICATIONS

Querbach, B.; Khanna, R.; Blankenbeckler, D.; Yulan Zhang; Anderson, R.T.; Ellis, D.G.; Schoenborn, Z.T.; Deyati, S.; Chiang, P., "A reusable BIST with software assisted repair technology for improved memory and IO debug, validation and test time," Test Conference (ITC), 2014 IEEE International , vol., no., pp. 1,10, Oct. 20-23, 2014.*

(Continued)

*Primary Examiner* — Cynthia Britt
(74) *Attorney, Agent, or Firm* — Cantor Colburn LLP; Margaret McNamara

(57) ABSTRACT

A method of performing root cause identification for a failure on an integrated circuit with a logic built-in self-test (LBIST) system and an LBIST system to perform root cause identification are described. The method includes completing one or more cycles of test with the LBIST system, each of the one or more cycles implementing one or more macros associated with each of one or more channel scan paths. The method also includes identifying, using a processor, a failing cycle among the one or more cycles of test, identifying a failing channel scan path among the one or more channel scan paths associated with the failing cycle, and identifying the one or more macros associated with the failing channel scan path. The method further includes iteratively checking each of the one or more macros associated with the failing channel scan path to perform the root cause identification.

9 Claims, 3 Drawing Sheets

(56) References Cited

U.S. PATENT DOCUMENTS

| | | | |
|---|---|---|---|
| 6,807,645 B2* | 10/2004 | Angelotti et al. | 714/732 |
| 6,901,546 B2 | 5/2005 | Chu et al. | |
| 7,558,996 B2* | 7/2009 | Kiryu | 714/726 |
| 7,856,582 B2* | 12/2010 | Cervantes et al. | 714/732 |
| 2004/0230882 A1 | 11/2004 | Huott et al. | |
| 2007/0273401 A1 | 11/2007 | Kiryu | |
| 2009/0089636 A1* | 4/2009 | Fernsler et al. | 714/728 |
| 2009/0292963 A1 | 11/2009 | Gass et al. | |
| 2009/0307548 A1 | 12/2009 | Forlenza et al. | |
| 2010/0262879 A1 | 10/2010 | Floyd et al. | |

OTHER PUBLICATIONS

Prabhu, S.; Acharya, V.V.; Bagri, S.; Hsiao, M.S., "A diagnosis-friendly LBIST architecture with property checking," Test Conference (ITC), 2014 IEEE International, vol., no., pp. 1,9, Oct. 20-23, 2014.*

Lai et al., "Hardware Efficient LBIST With Complementary Weights", Proceedings of the 2005 International Conference on Computer Design, 2005, pp. 1-3.

Meehl et al., "LBIST/ATPG technologies for on-demand digital logic testing in Automotive Circuits", IEEE 21st Asian Test Symposium, 2012, 1 page.

List of IBM Patents or Patent Applications Treated as Related; (Appendix P), Filed Oct. 1, 2014; 2 pages.

Donato O. Forlenza et al., "Logic-Built-In-Self-Test Diagnostic Method for Root Cause Identification", U.S. Appl. No. 14/502,455, filed Sep. 30, 2014.

* cited by examiner

LOGIC-BUILT-IN-SELF-TEST DIAGNOSTIC METHOD FOR ROOT CAUSE IDENTIFICATION

BACKGROUND

The present invention relates to logic-built-in-self-test (LBIST) of macros, and more specifically, to an LBIST diagnostic method for root cause identification.

A macro in an integrated circuit, for example, is an instruction sequence that implements a logic circuit (e.g., AND gate) when executed. LBIST includes hardware elements, software elements, or a combination of the two built into an integrated circuit (IC) to allow self-tests of the macros. The LBIST may use an architecture that is referred to as self-test using MISR and parallel SRSG (STUMPS) architecture, where MISR refers to a multiple input signature register, and SRSG refers to a shift register sequence generator. The STUMPS architecture includes different channel scan paths (referred to as "channels" or "STUMPS channels") that are each formed between a pseudo-random pattern generator (PRPG) (e.g., a linear feedback shift register (LFSR)) and the MISR, which is a state machine. Generally in a test (in a scan mode), an LBIST controller loads the multiple channel scan paths (STUMPS channels) with respective test patterns, and the IC is operated for one or more clock cycles. That is, the STUMPS channels apply the pseudo-random test data to the system logic or the macros from the PRPG. The operation changes the states at nodes of the circuit, and the state changes affect what is stored in one or more scan channel registers in the MISR. When the IC is returned to scan mode, the data in the MISR is shifted out and evaluated by comparing the obtained data with expected data.

SUMMARY

According to one embodiment, a method of performing root cause identification for a failure on an integrated circuit with a logic built-in self-test (LBIST) system includes completing one or more cycles of test with the LBIST system, each of the one or more cycles implementing one or more macros associated with each of one or more channel scan paths; identifying, using a processor, a failing cycle among the one or more cycles of test; identifying a failing channel scan path among the one or more channel scan paths associated with the failing cycle; identifying the one or more macros associated with the failing channel scan path; and iteratively checking each of the one or more macros associated with the failing channel scan path to perform the root cause identification.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, a LBIST using STUMPS architecture may be used for self-testing within an IC. A persistent (repeatable) failure may be identified through the current testing process. However, an intermittent failure presents a challenge to current LBIST procedures. That is, certain failure mechanisms become a moving target that may be difficult to identify with current diagnostic techniques. Embodiments of the systems and method discussed herein relate to an LBIST diagnostic procedure that facilitates root cause identification over a broad range of failure mechanisms.

Figure 1:
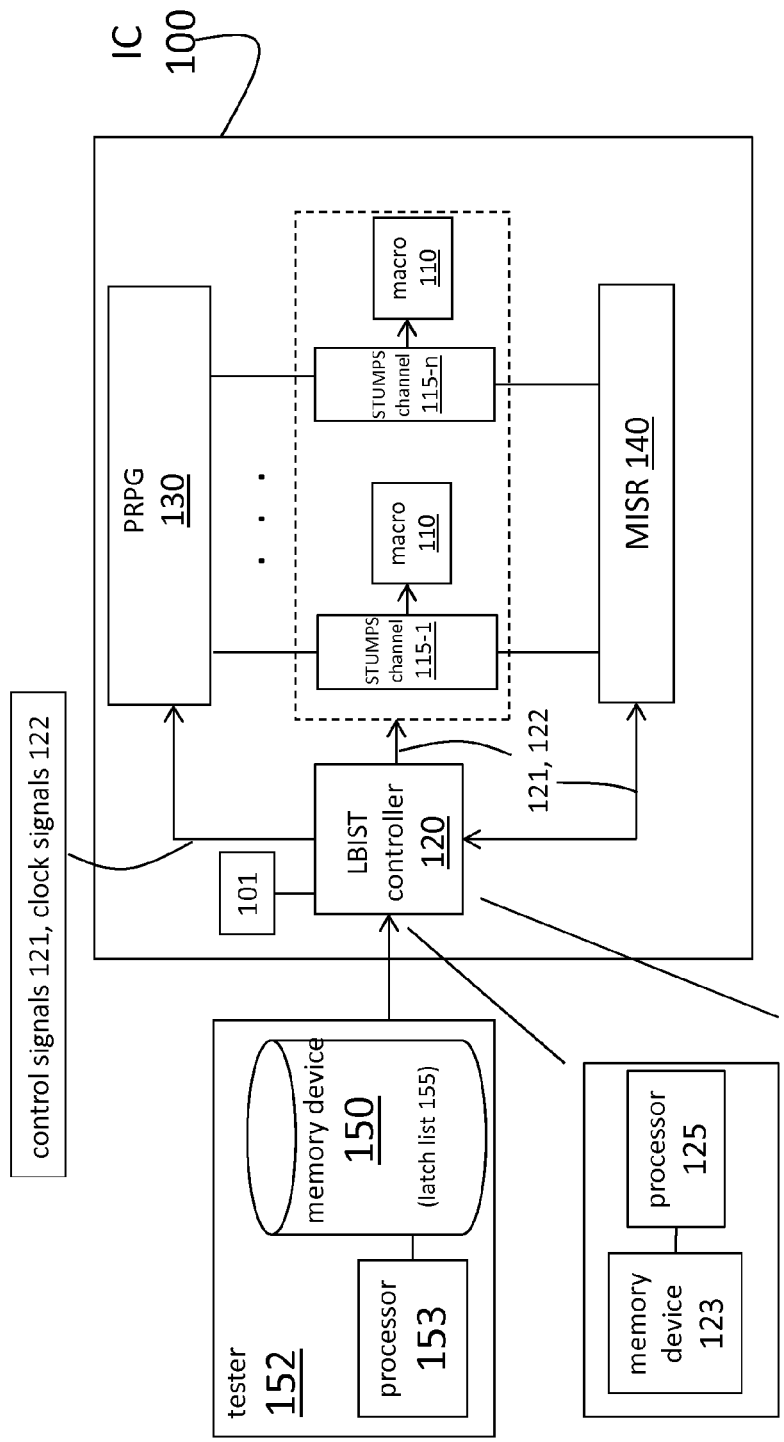
FIG. 1 is a simplified block diagram of an IC including an LBIST system according to an exemplary embodiment.

FIG. 1 is a simplified block diagram of an IC 100 including an LBIST system according to an exemplary embodiment. The LBIST system is implemented by an LBIST macro for testing the macros 110 (system logic) of the IC 100. Each of the channel scan paths or STUMPS channels 115-1 through 115-n includes one or more elements coupled to a macro 110 or system logic component being tested. Thus, although one macro 110 is shown in correspondence to each STUMPS channel 115, more than one macro 110 may be associated with a given STUMPS channel 115. The STUMPS channels 115 receive pseudo-random data via the pseudo-random pattern generator (PRPG) 130 and provide their output to the multiple input signature register (MISR) 140. An LBIST controller 120 provides control signals 121 and clock signals 122 to control the testing of the macros 110. An off-chip tester 152 including one or more processors 153 and one or more memory devices (150) may control operation of the LBIST controller 120, and the tester 152 (or an off-line diagnostic system coupled to the tester 152) may analyze results of test cycles to perform root cause identification, as discussed herein. In alternate embodiments, an on-chip processor 101 (e.g., a component of the design for test (DFT) macros) may initiate LBIST controller 120 actions and analyze results to perform the root cause identification discussed herein (based on instructions stored in accessible memory on the IC 100). The embodiments of root cause identification discussed herein are not limited by where (on or off IC 100) the failure analysis and root cause identification is performed. Additional details of the LBIST system such as the spreader, compressor, are known and are not detailed herein. Embodiments of the root cause identification detailed herein are performed with a processor (153, 101) controlling the LBIST controller 120 that includes one or more memory devices 123 and one or more processors 125. Once the LBIST controller 120 has completed one or more test cycles, the off-chip tester 152 or on-chip processor 101 compares the MISR 140 data (output by the STUMPS channels 115-1 through 115-n based on operations of the macros 110 for each clock cycle) with expected data and performs processes described with reference to FIG. 2 below to identify the root cause of a fault. Storage device 150 (e.g., a database), shown as part of the tester 152, includes a clock-off latch list 155 for the macros 110, which is discussed below. This clock-off latch list 155, like the alternate processor 101 to perform root cause identification, may instead be stored on the IC 100 itself.

Figure 2:
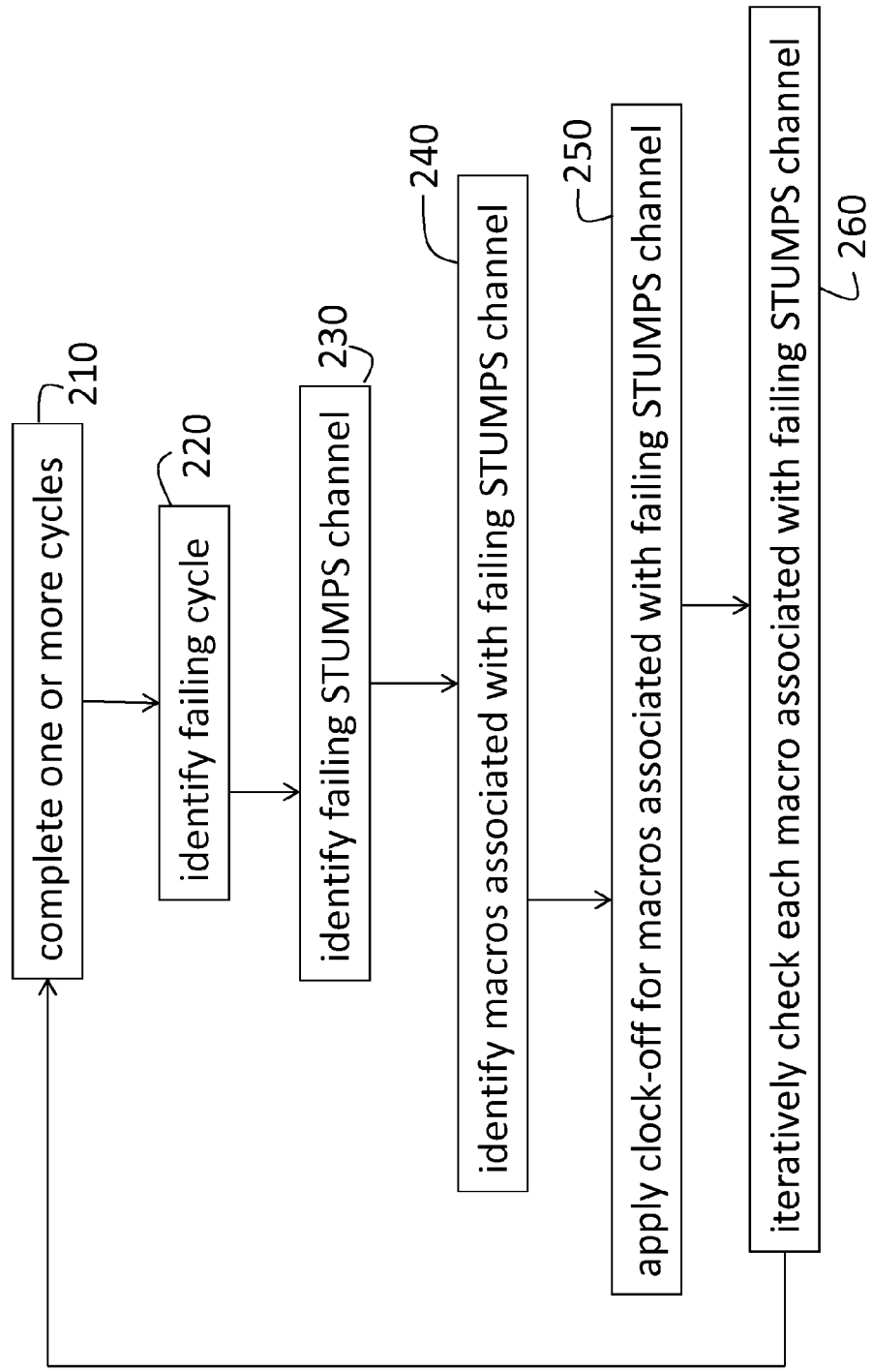
FIG. 2 is a process flow of a method of root cause identification of a failure in an IC during implementation of LBIST according to an exemplary embodiment.

FIG. 2 is a process flow of a method of root cause identification of a failure in an IC 100 resulting from implementation of the LBIST system according to an exemplary embodiment. At block 210, completing one or more cycles of operation includes operating all the macros 110 using pseudo-random data. Identifying a failing cycle, at block 220, includes identifying the first failing cycle when the process is first implemented. That is, typically, some number (e.g., 4000-1,000,000) of cycles are completed and then the MISR 140 data is compared with the expected data to determine whether a failure occurred in at least one cycle. The first cycle that includes a failure (unexpected MISR output) is identified as a failing cycle at block 220. At block 230, identifying the failing STUMPS channel 115 of the failing cycle leads to identifying macros 110 associated with the failing STUMPS channel 115 at block 240. When the macros 110 associated with the failing STUMPS channel 115 are identified (at block 240), a clock-off is applied to the macros 110 associated with the failing STUMPS channel 115 at block 250. This means that the macros 110 are disabled or prevented from executing. The clock-off latch list 155 may be stored off-chip (e.g., storage device 150) or on-chip (on IC 100). At block 260, iteratively checking each macro 110 associated with the failing STUMPS channel 115 facilitates identification of the failing macro 110 (the root cause identification). This iterative process is detailed below with reference to FIG. 3. The processes shown in FIG. 2 may, themselves, be iterative. That is, operation may return to block 210 from block 260 to complete more cycles of operation of the LBIST process or perform root cause identification for another cycle with a failure in the initial set of test cycles, as needed.

Figure 3:
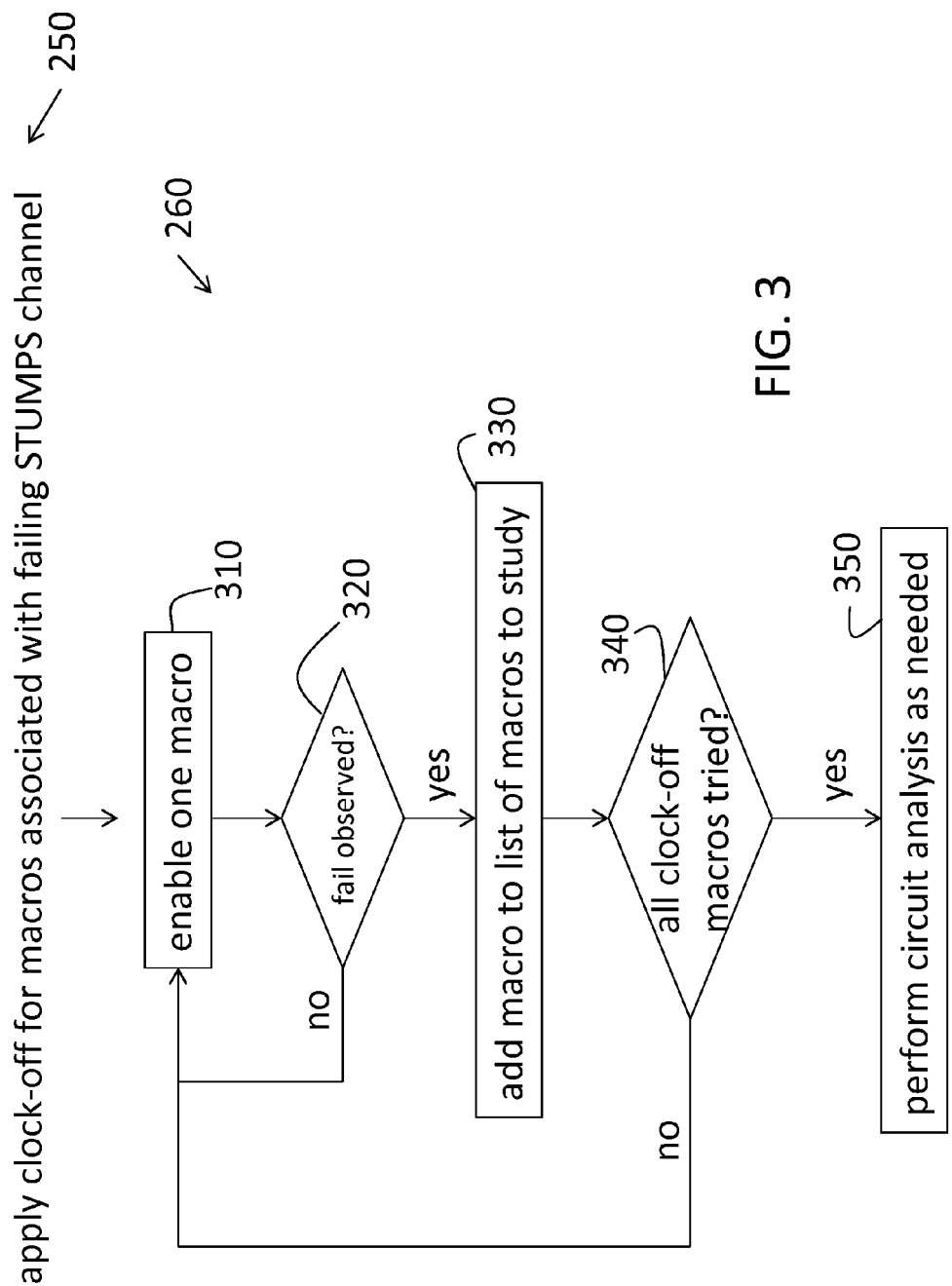
FIG. 3 is a process flow of a method of checking each macro associated with a failing STUMPS channel according to an exemplary embodiment.

FIG. 3 is a process flow of a method of checking each macro 110 associated with a failing STUMPS channel 115. The processes shown in FIG. 3 detail block 260 in FIG. 2, which is implemented after applying a clock-off to all the macros 110 associated with a failing STUMPS channel 115 (block 250, FIG. 2). At block 310, enabling one macro 110 (among the macros 110 that are clocked off) facilitates executing the cycle of testing to determine if a fail was observed, at block 320. That is, enabling refers to making it possible to execute the macro 110 and observe whether a fail (unexpected output) occurred. If a fail was not observed, the macro 110 that was enabled at block 310 is not a failing macro 110, and the process returns to enabling another macro 110 at block 310 (the non-failing enabled macro 110 is left enabled). If a fail was observed at block 320 (i.e., enabling the one macro 110 results in a failure), then the processes include adding the enabled macro 110 to the list of macros 110 to study at block 330. The failing enabled macro 110 is disabled again to facilitate checking the remaining macros 110. At block 340, a determination is made about whether all of the clocked-off macros 110 were tried (enabled and re-tested). When all of the clocked-off macros 110 (clocked off at block 250, FIG. 2) have not been enabled and re-tested (block 310), the process continues (returns to block 310). When all the clocked-off macros 110 have been enabled and re-tested (based on the check at block 340), then performing circuit analysis as needed, at block 350, pertains to the macros 110 that were added to the list of macros 110 to study at block 330. The circuit analysis at block 350 is performed to identify the failing latch of the failing macro 110. According to one embodiment, the identification of the failing latch may follow an iterative process of enabling one latch at a time, like the process described with reference to FIG. 3 to enable one macro 110 at a time.

Technical effects and benefits include the capability of identifying a root cause (at a macro level or latch level) of a failure (unexpected output) during testing of an integrated circuit.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of performing root cause identification for a failure on an integrated circuit with a logic built-in self-test (LBIST) system, the method comprising:
    completing one or more cycles of test with the LBIST system, each of the one or more cycles enabling one or more macros associated with each of one or more channel scan paths;
    identifying, using a processor, a failing cycle among the one or more cycles of test;
    identifying a failing channel scan path among the one or more channel scan paths associated with the failing cycle;
    identifying the one or more macros associated with the failing channel scan path; and
    iteratively checking each of the one or more macros associated with the failing channel scan path to perform the root cause identification.

2. The method according to claim 1, wherein the enabling the one or more macros associated with each of the one or more channel scan paths includes executing logic on the one or more macros of each of the one or more channel scan paths with data from a pseudo-random pattern generator.

3. The method according to claim 1, wherein the identifying the failing cycle and the identifying the failing channel scan path includes comparing outputs of the one or more macros of each of the one or more channel scan paths, output to a multiple input signature register (MISR), with expected values.

4. The method according to claim 1, wherein the iteratively checking each of the one or more macros associated with the failing channel scan path includes applying a clock-off signal to all of the one or more macros associated with the failing channel scan path.

5. The method according to claim 4, wherein the iteratively checking each of the one or more macros associated with the failing channel scan path includes iteratively enabling one of the one or more macros associated with the failing channel scan path at each iteration.

6. The method according to claim 5, wherein the iteratively enabling one of the one or more macros associated with the failing channel scan path at each iteration includes executing the one of the one or more macros associated with the failing channel scan path enabled at each iteration to determine whether the failure is resolved or not resolved.

7. The method according to claim 6, further comprising identifying the one of the one or more macros associated with the failing channel scan path as a non-failing macro when the failure is resolved.

8. The method according to claim 6, further comprising identifying the one of the one or more macros associated with the failing channel scan path as a failing macro when the failure is not resolved.

9. The method according to claim 1, further comprising performing circuit analysis on each macro, of the one or more macros associated with the failing channel scan path, identified as a failing macro to identify one or more failing latches.

* * * * *